United States Patent
Rhodes et al.

(10) Patent No.: US 6,405,150 B1
(45) Date of Patent: Jun. 11, 2002

(54) PROGRAM STORAGE DEVICE CONTAINING INSTRUCTIONS THAT ARE SPACED APART BY UNUSED BITS THAT END ON WORD BOUNDARIES AND WHICH GENERATE CHIP TESTING BIT STREAMS OF ANY LENGTH

(75) Inventors: James Vernon Rhodes; Robert David Conklin; Timothy Allen Barr, all of Chandler, AZ (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/387,197

(22) Filed: Aug. 31, 1999

(51) Int. Cl.⁷ ............................. G11C 7/00; G06F 11/00
(52) U.S. Cl. ................... 702/123; 702/117; 714/741; 714/724; 714/730; 365/201
(58) Field of Search ................... 702/110, 117, 702/118, 119, 123; 714/724, 727, 730, 735, 741; 365/201

(56) References Cited

U.S. PATENT DOCUMENTS 5,867,723 A * 2/1999 Chin et al. ............. 395/800.11
6,173,238 B1 * 1/2001 Fujisaki ................... 702/117
6,205,567 B1 * 3/2001 Maruyama ................ 714/741
6,233,182 B1 * 5/2001 Satou et al. ............... 365/200
6,237,122 B1 * 5/2001 Maki ....................... 714/730

* cited by examiner

*Primary Examiner*—Marc S. Hoff
*Assistant Examiner*—Paul Kim
(74) *Attorney, Agent, or Firm*—Charles J. Fassbender; Mark T. Starr; Lise A. Rode

(57) ABSTRACT

A system for testing integrated circuit chips is comprised of a pattern generator that is coupled to a memory which stores variable length instructions that specify sets of bit streams for testing the chips. Each variable length instruction includes a code which indicates the number of bit streams in the set. Each bit stream in the set consists of a selectable number of bits which start on a word boundary and vary in increments of one bit. If the code indicates that the number of bit streams in a set is only one, then that one bit stream is stored in consecutive words of the memory. If the code indicates the number bit streams in a set is more than one, then those multiple bit streams are stored in an interleaved fashion in consecutive words in the memory. A respective series of unused bits starts immediately after each bit stream and ends on a word boundary. Each series of unused bits causes the next bit stream to start on a word boundary; and, that simplifies the circuitry which the pattern generator uses to address the bit streams.

13 Claims, 11 Drawing Sheets

FIG. 3
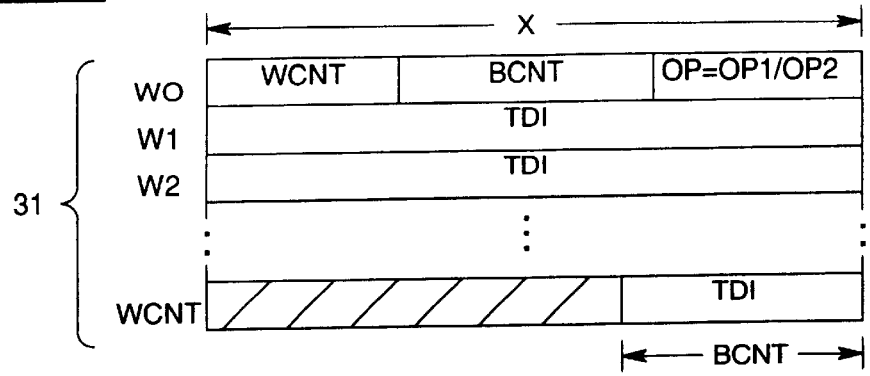
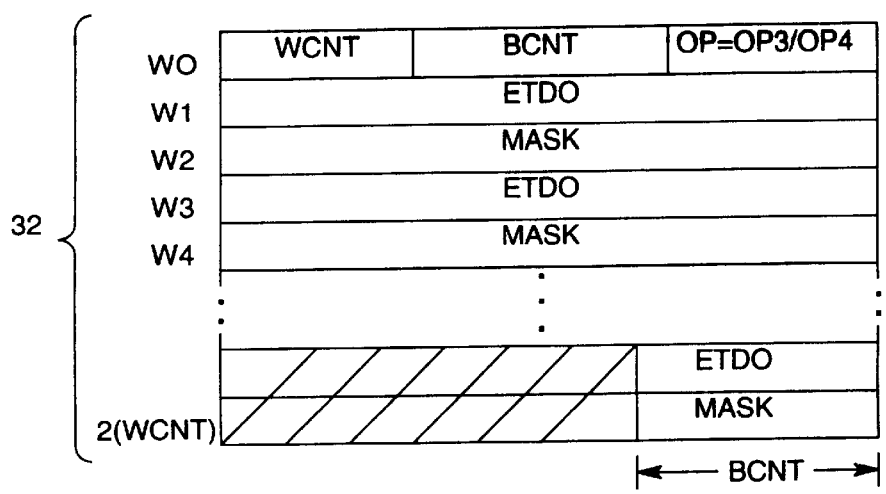
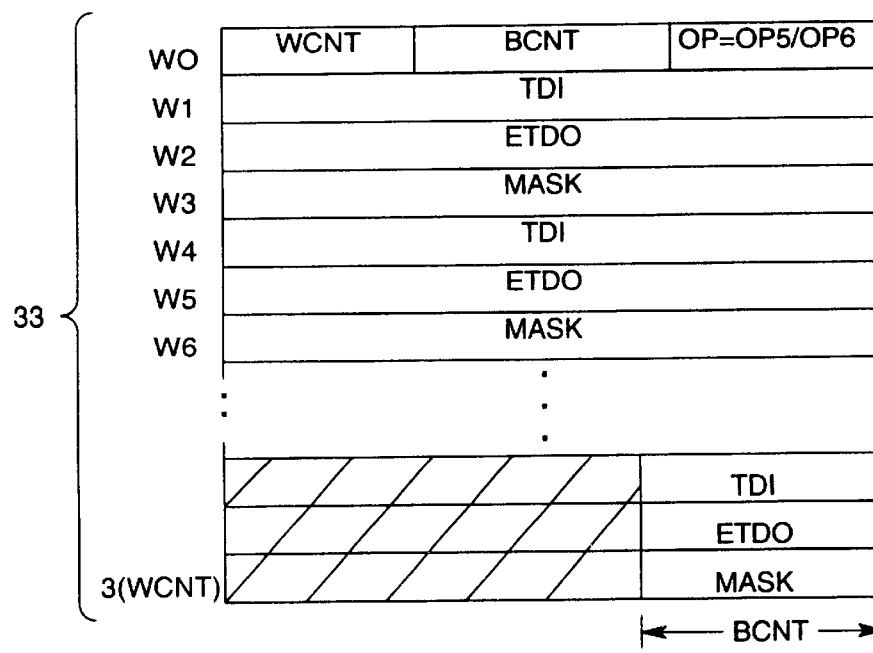

PROGRAM STORAGE DEVICE CONTAINING INSTRUCTIONS THAT ARE SPACED APART BY UNUSED BITS THAT END ON WORD BOUNDARIES AND WHICH GENERATE CHIP TESTING BIT STREAMS OF ANY LENGTH

RELATED CASES

The present invention, as identified by the above docket number and title, is relate to two other inventions, which are described herein with one common Detailed Description. These two related inventions are entitled "AN ELECTRONIC SYSTEM FOR TESTING CHIPS HAVING A SELECTABLE NUMBER OF PATTERN GENERATORS THAT CONCURRENTLY BROADCAST DIFFERENT BIT STREAMS TO SELECTABLE SETS OF CHIP DRIVER CIRCUITS", having U.S. Ser. No. 09/386,946; and entitled "AN ELECTRONIC SYSTEM FOR TESTING A SET OF MULTIPLE CHIPS CONCURRENTLY OR SEQUENTIALLY IN SELECTABLE SUBSETS UNDER PROGRAM CONTROL TO LIMIT CHIP POWER DISSIPATION", having U.S. Ser. No. 09/386,945. Patent applications on all three inventions were filed concurrently in the U.S. Patent Office on Aug. 31, 1999.

BACKGROUND OF THE INVENTION

The present invention, as recited by the claims, covers a program storage device containing instructions that are spaced apart by unused bits that end on word boundaries and which generate chip testing bit streams of any length. In the prior art, a related electronic system for testing chips is disclosed in U.S. Pat. No. 5,390,129. This prior art system is assigned to Unisys Corporation, who also is the assignee of the present invention.

A simplified block diagram of the prior art chip testing system is shown in FIG. 2 of patent '129. That system includes a computer 50 which is coupled via a time-shared bus 52 to a plurality of driver boards 100; and each driver board 100 is coupled to a respective burn-in board 500 which holds several integrated circuit chips that are to be tested.

In operation, the computer 50 sequentially sends each driver board 100 a separate set of test data patterns that are used to test the chips. These test data patterns are stored on each driver board in a large SRAM which is shown in FIG. 3 by reference numeral 107 and is shown in greater detail in FIG. 9 by reference numeral 145. Which particular driver board receives and stores the test data patterns at any one time is determined by an address circuit 100A that is on the driver board, as is shown in the FIG. 2 block diagram.

After the test data patterns are stored in the SRAM 145 on all of the driver boards 100, then the chips on all of the burn-in boards 500 can be tested in parallel. To do that, the test patterns are concurrently read from all of the SRAMs and sent through respective output driver modules 164, as shown in FIG. 14, to the chips on all of the burn-in boards 500.

One particular feature of the chip testing system in patent '129 is that each burn-in board includes an ID code which identifies the types of chips that are to be tested on the board. That ID code is sensed by the driver board 100 and sent to the computer 50; and in response, the test data patterns which the computer 50 sends to the driver board are tailored to the ID code that is sensed.

However, the chip testing system in patent '129 also has some major limitations which are imposed by the FIG. 2 architecture. For example, the computer 50 is the sole source of the test data patterns for all of the driver boards 100. Consequently, the speed of operation of the chip testing system is limited because the computer 50 can only send the test data patterns to a single driver board at a time over the bus 52.

Another limitation of the chip testing system in patent 3 129 is that each driver board 100 always tests all of the chips on a burn-in board 500 concurrently. However, each burn-in board inherently has a limit on the total amount of power which the chips on the board can dissipate. Thus, in order to keep the total power dissipation on each burn-in board 500 below a certain limit, the total number of chips on each burn-in board must be decreased as the maximum, power dissipation per chip increases.

Still another limitation of the chip testing system in patent '129 is that the stored test data patterns in the large SRAM 145 on each driver board can make very inefficient use of the SRAM memory cells. FIG. 9 of patent 3 129 shows that each SRAM 145 receives nineteen address bits and has eight data output bits; and thus the SRAM 145 on each driver circuit has eight million memory cells. But, certain types of chips are tested by sending them sequences of serial bit streams that vary in number with time. Thus, if an SRAM 145 sends four bit streams during one time interval and sends only two bit streams during other time intervals, then half of the SRAM is wasted when the two bit streams are being sent.

Accordingly, a primary object of the chip test testing system which is disclosed herein is to address and overcome all of the above limitations.

BRIEF SUMMARY OF THE INVENTION

The present invention, as recited by the claims, covers one aspect of the disclosed chip testing system which addresses the above limitation regarding inefficient storage of the test data patterns. In accordance with the present invention, a system for testing integrated circuit chips is comprised of a pattern generator that is coupled to a memory which stores variable length instructions that specify sets of bit streams for testing the chips. Each variable length instruction includes a code which indicates the number of bit streams in the set. Each bit stream in the set consists of a selectable number of bits which start on a word boundary and vary in increments of one bit. A respective series of unused bits starts immediately after each bit stream and ends on a word boundary.

If the code indicates that the number of bit streams in a set is only one, then that one bit stream is stored in consecutive words of the memory. If the code indicates the number bit streams in a set is more than one, then those multiple bit streams are stored in an interleaved fashion in consecutive words in the memory. Consequently, the only memory cells that are wasted are those which store the unused bits after each bit stream. But, those unused bits cause the next bit stream to start on a word boundary; and, that simplifies the circuitry which the pattern generator uses to address each bit stream.

BRIEF DESCRIPTION OF THE DRAWINGS

FIG. 3 shows three different types of variable length instructions which are executed by the FIG. 1 system to test integrated circuit chips.

DETAILED DESCRIPTION

Figure 1:
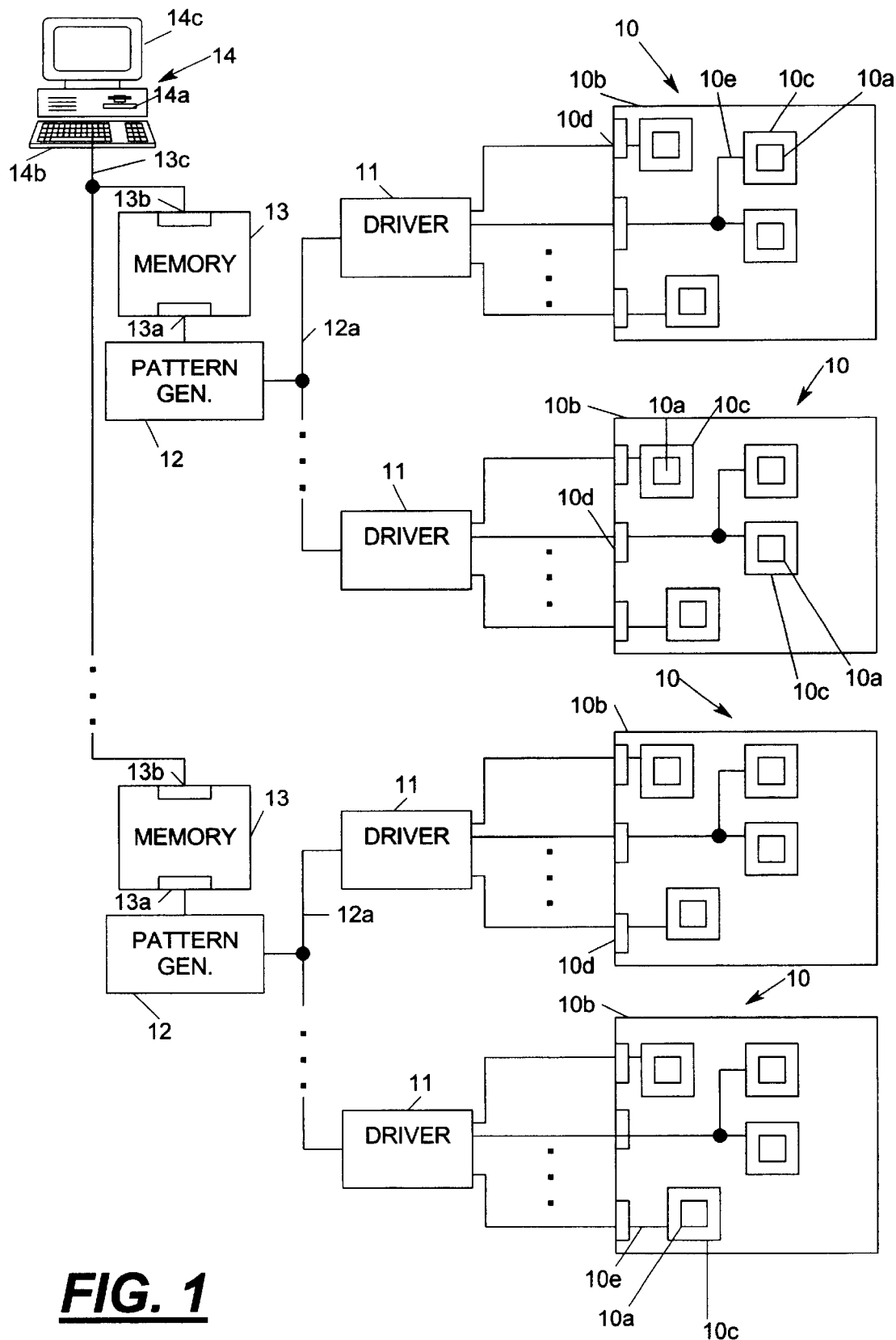
FIG. 1 shows a block diagram of a chip testing system which constitutes one preferred embodiment of the present invention.

With reference now to FIG. 1, one embodiment of a system which tests integrated circuit chips in accordance with the present invention will be described. This system is comprised of five different types of modules 10–14; and a description of each module is given below in TABLE 1.

TABLE 1

Figure 5:
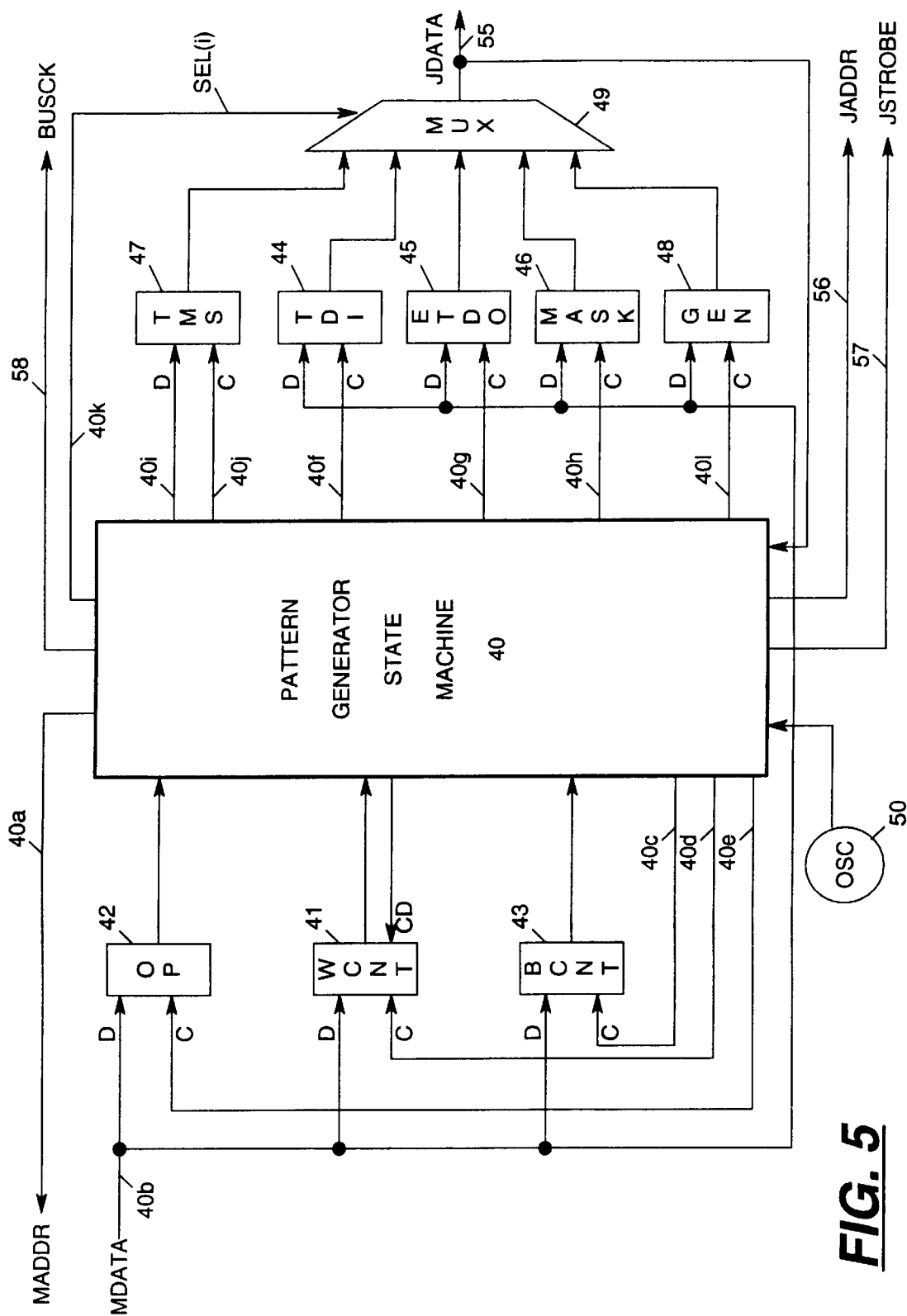
FIG. 5 shows the internal details of a pattern generator which occurs in selectable quantities in the FIG. 1 system.
Figure 6:
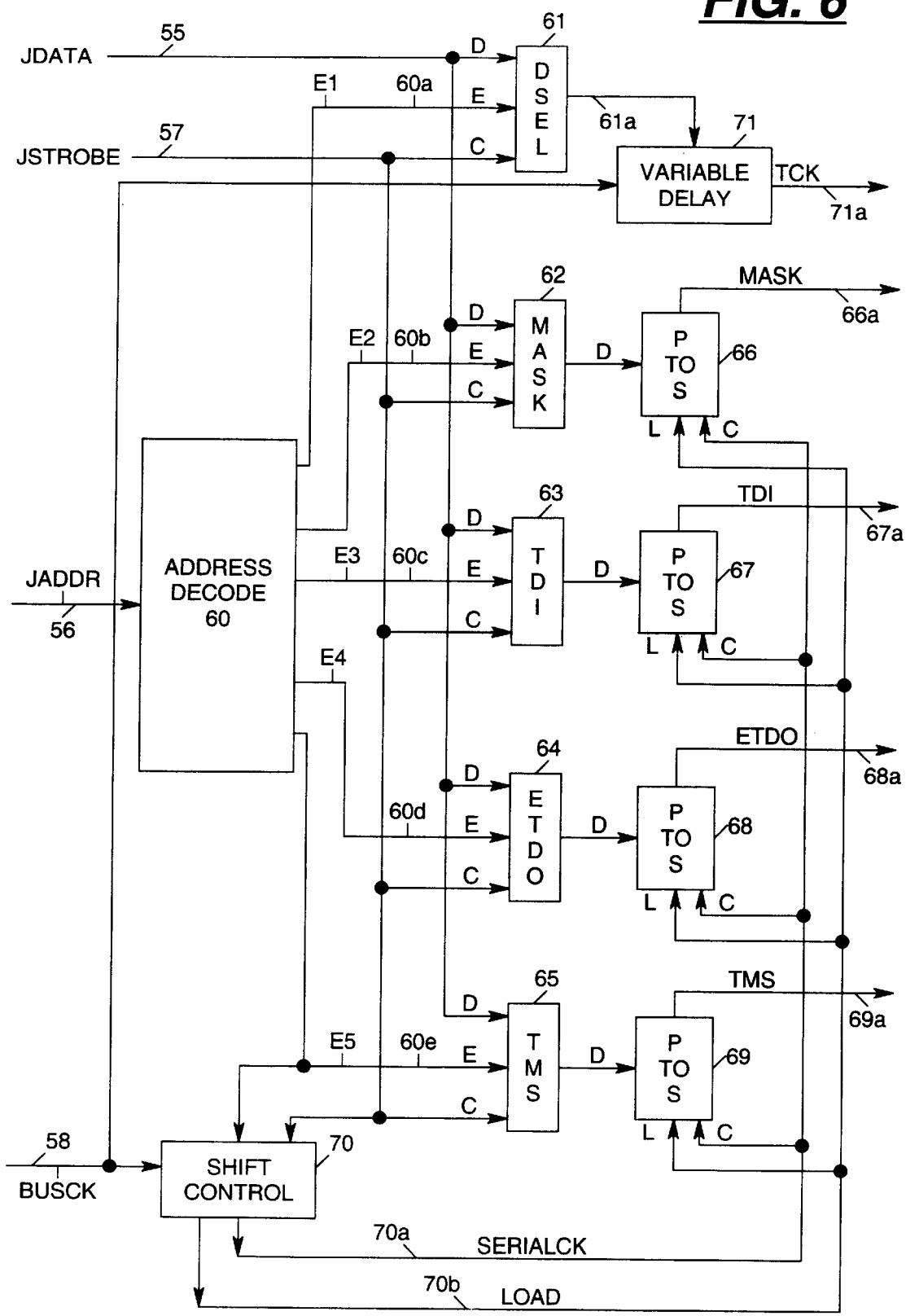
FIG. 6 shows the internal details of a chip driver circuit which occurs in selectable quantities in the FIG. 1 system.

| Module | Description |
| --- | --- |
| 10 | Each module 10 is a chip assembly which holds several integrated circuit chips 10a while they are tested. In the FIG. 1 system, the total number of chip assemblies 10 is selectable. Each chip assembly 10 includes one printed circuit board 10b on which several sockets 10c are soldered, and each socket holds one of the chips 10a. Connectors 10d are mounted on an edge of the printed circuit board 10b, and electrical conductors 10e in the printed circuit board carry test signals between the connectors 10d and the chips 10a. |
| 11 | Each module 11 is a chip driver circuit. In the FIG. 1 system, a separate chip driver circuit 11 is provided for each chip assembly 10. Each chip driver circuit 11 includes all of the circuitry which is shown in FIGS. 6, 8, 9, and 10. By that circuitry, test signals are sent to and received from the chips 10a as various bit-serial sequences which are programmable. |
| 12 | Each item 12 is a pattern generator. In the FIG. 1 system, each pattern generator 12 is coupled via a bus 12a to a selectable number of chip driver circuits. FIG. 1 shows an example where all of the chip driver circuits 11 are partitioned into subgroups, and a separate pattern generator 12 is coupled via a separate bus 12a to each subgroup. Alternatively, all of the chip driver circuits 11 can be coupled by a single bus 12a to a single pattern generator; or, each chip driver circuit 11 can be coupled by a separate bus 12a to a separate pattern generator. Each pattern generator 12 includes all of the circuitry which is shown in FIGS. 5 and 6. By that circuitry, each pattern generator 12 executes a separate sequence of programmable instructions that specify particular bit-serial sequences for testing the chips 10c. In executing the instructions, each pattern generator 12 partitions the bit-serial sequences into words and broadcasts the words to all of the chip driver circuits 11 which are coupled to its bus 12a. |
| 13 | Each item 13 is a random access read-write memory. A separate memory 13 is provided for each pattern generator 12. Each memory 13 stores separate sequences of programmable instructions which are executed by the corresponding pattern generator. These instructions are read from the memory 13 by the pattern generator 12 via an access port 13a, and they are written into the memory via another access port 13b. Both access ports operate concurrently; so some instructions can be read from port 13a while at the same time other instructions can be written into port 13b. |
| 14 | Module 14 is a single host computer which directs the operation of the entire FIG. 1 system. The host computer 14 is coupled via a bus 13c to port 13b on all of the memories 13. Included within the host computer 14 is a disk 14a, a keyboard 14b, and a monitor 14c. Stored on the disk 14a are several programs for the pattern generators 12; and each such program includes a different set of the programmable instructions that specify particular bit-serial sequences of signals for testing the chips 10c. To select one of the programs and send it to the memory 13 of a particular pattern generator, an operator (not shown) enters various commands to the host computer 14 via the keyboard 14b. Thereafter, the results that are obtained from testing the chips with the selected program are stored by the pattern generator in the memory 13; and they are displayed by the host computer 14 on the monitor 14c. |

Figure 2:
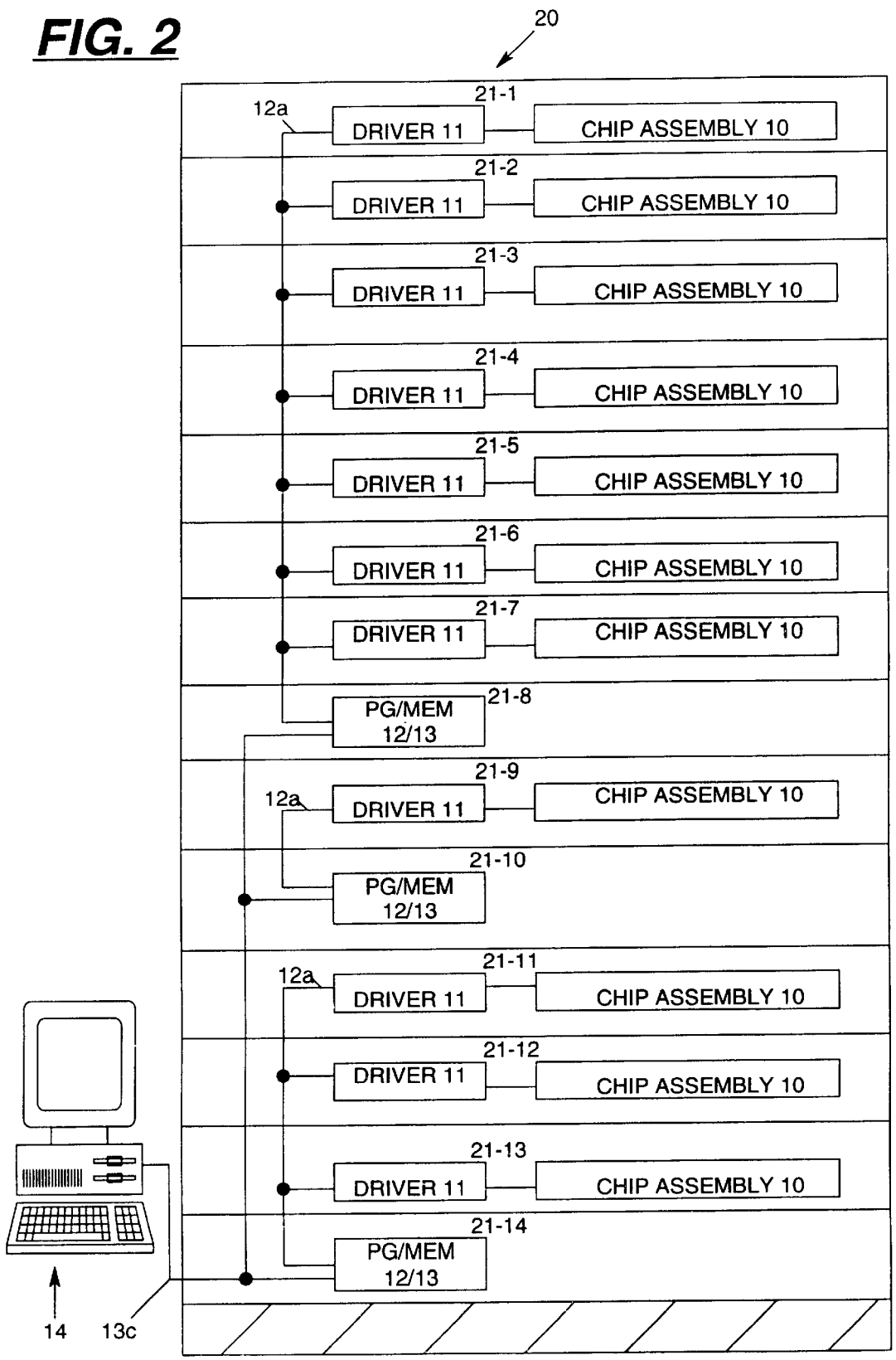
FIG. 2 shows how the chip testing system of FIG. 1 is physically packaged.

Referring next to FIG. 2, it shows how all of the modules 10–14 are physically packaged together as one system. Item 20 in FIG. 2 is a mechanical rack which has multiple horizontal slots 21-1, 21-2, etc. that are arranged on top of each other in a stack. Each slot selectively holds either one driver circuit 11 plus one chip assembly 10, or it holds one pattern generator 12 plus one memory 13.

FIG. 2 shows an example where the total number of slots in the rack 20 is fourteen. The top slot is 21-1; the next slot is 21-2, etc. In FIG. 2, the slots 21-1 thru 21-14 are occupied as follows.

Each of the slots 21-1 thru 21-7 holds a driver circuit 11 plus a chip assembly 10; and, the next slot 21-8 holds one pattern generator 12 plus its memory 13. The pattern generator 12 in slot 21-8 is coupled to the seven driver circuits in slots 21-1 thru 21-7 by a bus 12a. On that bus, the pattern generator in slot 21-8 broadcasts bit-serial test signals to all seven of the chip driver circuits that are in slots 21-1 thru 21-7.

Slot 21-9 holds a driver circuit 11 plus a chip assembly 10; and slot 21-10 holds one pattern generator 12 plus its memory 13. The pattern generator in slot 21-10 is coupled to the driver circuit in slot 21-9 by a bus 12a; and on that bus, the pattern generator in slot 21-10 sends bit-serial test signals to just the one chip driver circuit in slot 21-9.

Each of the slots 21-11 thru 21-13 holds a driver circuit 11 plus a chip assembly 10; and, the next slot 21-14 holds one pattern generator 12 plus its memory 13. The pattern generator in slot 21-14 is coupled to three driver circuits in slots 21-11 thru 21-14 by a bus 12$a$; and on that bus, the pattern generator in slot 21-14 broadcasts bit-serial test signals to all three of the chip driver circuits that are in slots 21-11 thru 21-13.

Each of the memories 13 in the slots 21-8, 21-10, and 21-14 store different sequences of several types of instructions which define the bit-serial test signals that are broadcast by the pattern generators 12. Three different types of the instructions are shown in FIG. 3. Instruction 31 is of a first type; instruction 32 is of a second type; and instruction 33 is of a third type.

Each first type instruction 31 includes a word W0 which contains an operation code OP, a word count WCNT, and a bit count BCNT. When the operation code has a particular value of OP1, instruction 31 causes a bit stream TDI to be written into a DATA REGISTER that is in the chip 10$a$ that is tested. When the operation code has another particular value of OP2, instruction 31 cause the TDI bit-stream to be written into an INSTRUCTION REGISTER that is in the chip 10$a$.

For both of the operation codes OP1 and OP2, the TDI bit stream which is to be written is specified within instruction 31 as shown in FIG. 3. This TDI bit stream starts immediately after word W0 and it has a length that varies in increments of one bit. The total number of bits in the TDI bit stream is (WCNT−1)(X)+BCNT, where X is the number of bits per word. All bits in the last word which do not specify the TDI bit stream are unused.

Each second type instruction 32 includes a word W0 which contains an operation code, a word count WCNT, and a bit count BCNT. When the operation code has a particular value of OP3, instruction 32 causes the content of the DATA REGISTER in the chip 10$a$ to be read and selectively compared with a data stream in the instruction. When the operation code has another particular value of OP4, instruction 32 causes the content of the INSTRUCTION REGISTER in the chip 10$a$ to be read and selectively compared with a data steam in the instruction.

For both of the operation codes OP3 and OP4, two bit streams ETDO and MASK are specified within the instruction 32 for use in the compare operation. Those two bit streams begin immediately after word W0, and they are interleaved word-by-word as shown in FIG. 3. If the i-th bit in the MASK bit stream is a "1", then the i-th bit which is read from the chip takes part in the compare operation; and that particular bit from the chip is compared to the i-th bit in the ETDO bit stream. Each of the bit streams ETDO and MASK are variable in length, and the total number of bits in each of those bit streams is (WCNT−1)(X)+BCNT. All of the bits in the last two words which do not specify the ETDO and MASK bit streams are unused.

Each third type instruction 33 includes a word W0 which contains an operation code OP, a word count WCNT, and a bit count BCNT. When the operation code has a particular value of OP5, instruction 33 causes a bit stream TDI to be written into a DATA REGISTER in the chip 10$a$, and concurrently, instruction 33 causes the content of the DATA REGISTER in the chip 10$a$ to be read and selectively compared with a data stream in the instruction. When the operation code has another particular value of OP6, instruction 33 causes the TDI bit stream to be written into the INSTRUCTION REGISTER in the chip 10$a$, and concurrently, instruction 33 causes the content of the INSTRUCTION REGISTER in the chip 10$a$ to be read and selectively compared with a data stream in the instruction.

For both of the operation codes OP5 and OP6, the TDI bit stream is specified within the instruction 33; and, two other bit streams ETDO and MASK are also specified within the instruction for use in the compare operation. These three bit streams begin immediately after word W0, and they are interleaved word-by-word as shown in FIG. 3. If the i-th bit in the MASK bit stream is a "1", then the i-th bit which is read from the chip takes part in the compare operation; and that particular bit from the chip is compared to the i-th bit in the ETDO bit stream. Each of the three bit streams TDI, ETDO, and MASK are variable in the length; and the total number of bits in each of those bit streams is (WCNT−1)(X)+(BCNT). All of the bits in the last three words which do not specify the TDI, ETDO and MASK bit streams are unused.

When the pattern generator 12 executes each of the instructions 31, 32, and 33, it also generates an additional bit stream which is not stated within the FIG. 3 instruction. That additional bit stream is used as a control signal, called TMS, which places the chip 10$a$ in particular states that selectively read the DATA REGISTER, write the DATA REGISTER, read the INSTRUCTION REGISTER, or write the INSTRUCTION REGISTER. Each TKS bit stream is generated in response to the operation codes OP1–OP6 which specify that either the instruction register or the data register should be used, and the WCNT and BCNT counts which determine the number of bits in the TMS signal.

Figure 4:
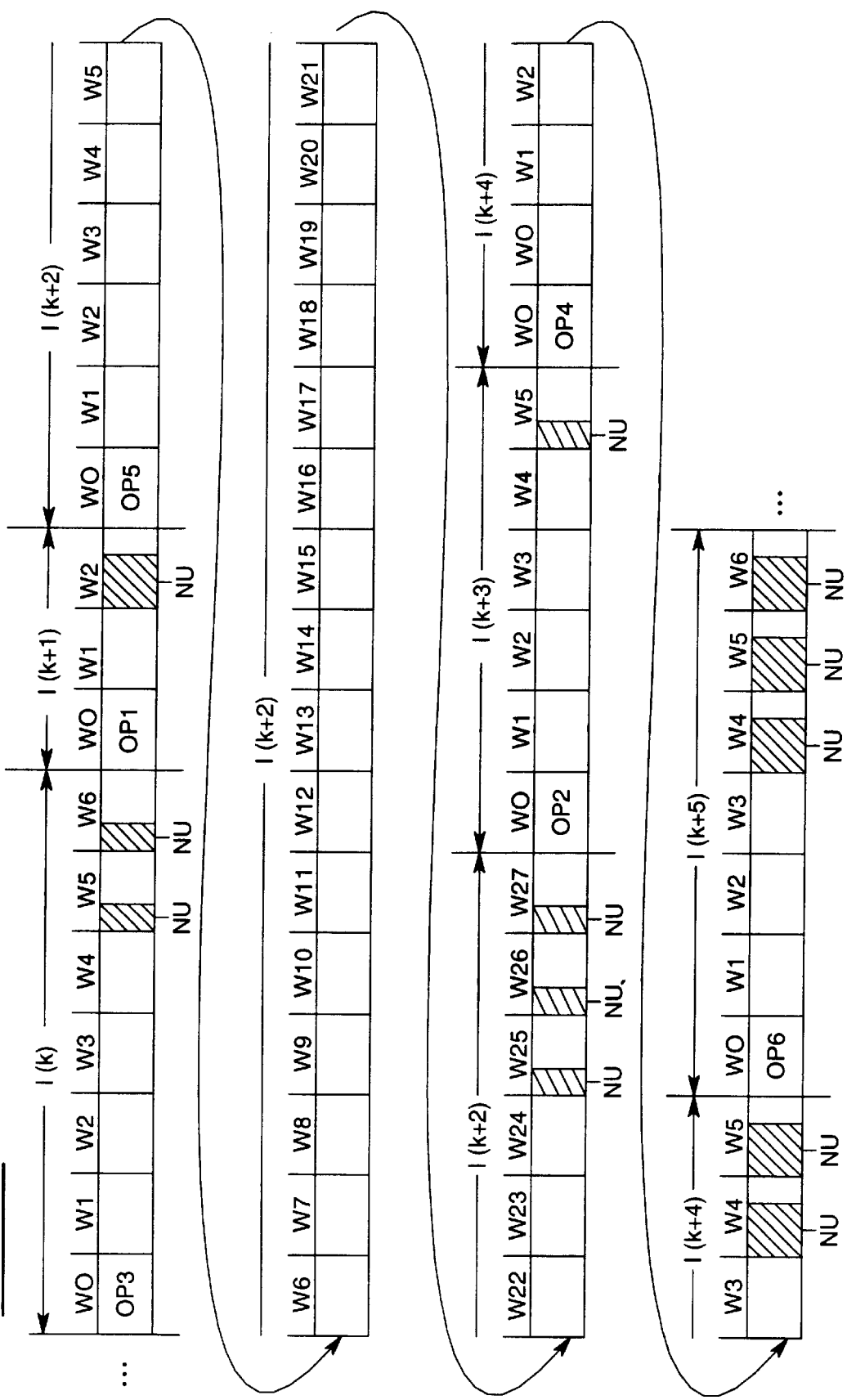
FIG. 4 shows an example of how the instructions of FIG. 3 are arranged in a sequence to form a test program.

FIG. 4 shows an example of how the three types of instructions 31, 32 and 33 are stored in different sequences within each memory 13 for a pattern generator 12. In the FIG. 4 example, the sequence of instructions is I(k), I(k+1), ... etc. Instructions I(k+1) and I(k+3) are of the first type 31; instructions I(k) and I(k+4) are of the second type 32; and instructions I(k+2) and I(k+5) are of the third type 33.

Each first type instruction 31 is identified by an operation code of OP1 or OP2, and it specifies a single variable length bit stream TDI. Each second type instruction 32 is identified by an operation code of OP3 or OP4, and it specifies two variable length bit streams ETDO and MASK. Each third type instruction 33 is identified by an operation code of OP5 or OP6, and it specifies three variable length bits streams TDI, ETDO and MASK. A respective series of bits which are not used (NU) start immediately after each serial bit stream and end on a word boundary; and that enables the next instruction in the sequence to always start on a word boundary.

Turning now to FIG. 5, the details of the circuitry that is within each pattern generator 12 will be described. That circuitry includes a sequential state machine 40, a counter 41, a set of seven registers 42–48, a multiplexer 49, and an oscillator 50. All of those components 40–50 are interconnected to each other as shown.

Counter 41, as well as each of the registers 42–48, has a set of data inputs D and a clock input C. To store the data on the inputs D into the counter or a particular register, the state machine 40 sends a clock pulse to the clock input C. Counter 42 also has a countdown input CD; and, the counter decrements its stored count by one when a pulse is received on the CD input.

In operation, each of the components 41–48 is used by the state machine 40 to store the following information. Register 42 stores the operation code OP which occurs in the first word WO of the FIG. 3 instructions 31, 32 and 33. Counter 41 stores the word count WCNT, and register 43 stores the bit count BCNT, which occurs in the first word WO of each of the FIG. 3 instructions.

Register 44 stores one word of the bit stream TDI that occurs in the instructions 31 and 33 of FIG. 3. Register 45 stores one word of the bit stream ETDO which occurs in the instructions 32 and 33 of FIG. 3. And, register 46 stores one word of the bit stream MASK which occurs in the instructions 32 and 33 of FIG. 3.

Register 47 stores one word of the additional bit stream TMS that is internally generated by the pattern generator 12 during the execution of the FIG. 3 instructions. Register 48 is a general purpose register which stores various control bits that are used internally by both the pattern generator 12 and the chip driver circuits 11 in a manner which will be described shortly.

At the start of the execution of one of the FIG. 3 instructions, the pattern generator 12 reads the first word WO of the instruction from the memory 13. To perform that read operation, the state machine 40 sends a memory address MADDR on a set of address lines 40a that go to port 13a of the memory 13 that is shown in FIG. 1. In response, port 13a of the memory 13 sends the addressed word as memory data MDATA on a set of data lines 40b back to the state machine 40. Then, the state machine 40 sends a clock pulse on three clock lines 40c–40e to store the OP code in register 42, store the word count WCNT in counter 41, and store the bit count BCNT in register 43.

Thereafter, the state machine 40 examines the OP code which is in register 42. If the OP code in register 42 indicates that the instruction is of a type which includes a TDI data stream, then the first word of that data stream is read from the memory 13 and stored in register 44. If the OP code in register 42 indicates that the instruction is of a type which includes an ETDO data stream, then the first word of that data stream is read from the memory 13 and stored in register 45. If the OP code in register 42 indicates that the instruction is of a type which includes a MASK data stream, then the first word of the MASK data stream is read from the memory 13 and stored in register 46.

The above data stream words are obtained one at a time via the pattern generator state machine 40 by sequentially sending a memory address on the address lines 40a, and receiving the addressed word back from the memory 13 on the data lines 40b. Each received word from the memory 13 is stored in the appropriate register 44, 45, or 46 by sending a clock pulse on one of the clock lines 40f, 40g or 40h.

Following the above operation, the state machine 40 internally generates one word of the additional bit stream TMS that was previously described. That internally generated word of the TMS bit stream is sent on a set of signal lines 40i, and it is loaded into the TMS register 47 by a clock pulse on a clock line 40j.

Thereafter the state machine 40 uses the multiplexer 49 to sequentially pass the output of the registers 44–47, that were previously loaded, onto a set of data lines 55, which carry data signals called JDATA. To pass the output of a particular register through the multiplexer 49, the state machine 40 generates controls signals, called SEL(i), on a set of control lines 40k that go to the multiplexer 49.

While the output of a register is sent on the JDATA lines 55, the state machine 40 also generates address signals, called JADDR, on a set of address lines 56; and those address signals determine the destination for the JDATA signals. To indicate when the JDATA signals and JADDR signals are being sent, the state machine 40 sends a pulse called JSTROBE on a clock line 57. Also, the state machine 40 sends a free running clock called BUSCK on a clock line 58. All of the lines 55–58 together constitute the bus 12a which is shown in FIGS. 1 and 2 that connect the pattern generator 12 to a selectable number of chip driver circuits 11.

Next, with reference to FIG. 6, the details of the circuitry that is within each of the chip driver circuits 11 will be described. That circuitry include an address decoder 60, a set of five registers 61–65, a set of four parallel-to-serial shift registers 66–69, a shift control circuit 70, and a variable delay line 71. All of the components 60–71 are interconnected to each other as shown in FIG. 6.

Each of the registers 61–65 has a set of data inputs D, and enable input E, and a clock input C. The data inputs D receive the data signals JDATA from the FIG. 5 pattern generator, and the clock input C receives the JSTROBE clock pulse from the pattern generator. To store the JDATA signals into a particular register 61–65, a separate enable signal E1–E6 is sent to the enable input E of that register.

All of the enable signals E1–E5 for the registers 61–65 are generated by the address decode circuit 60 on a set of signal lines 60a–60e. Enable signal E1 is sent to register 61; enable signal E2 is sent to register 62; etc. These enable signals E1–E5 are generated in the address decoder 60 by decoding particular addresses on the JADDR address lines 56.

In operation, the pattern generator state machine 40 of FIG. 5 sends the JADDR, JDATA, and JSTROBE signals such that the registers 62–65 store the following information. One word of the MASK bit stream is stored in register 62; and that word is sent from the FIG. 5 register 47 through the multiplexer 50. One word of the TDI bit stream is stored in register 63; and that word is sent from the FIG. 5 register 44 through the multiplexer 50. One word of the ETDO bit stream is stored in register 64; and that word is sent from the FIG. 5 register 45 through multiplexer 50. One word of the TMS bit stream is stored in register 65; and that word is sent from the FIG. 5 register 47 through the multiplexer 50.

Each of the registers 62–65 is respectively coupled to a data input D on one of the parallel-to-serial shift registers 66–69. Those parallel-to-serial shift registers also have a LOAD input L and a CLOCK input C. If the LOAD signal on the input L is in a "1" state when the clock input C receives the rising edge of the SERIALCK clock signal, then all of the data input signals are stored in the parallel-to-serial shift registers 66–69. Otherwise, if the LOAD signal is in a "0" state when the rising edge of the SERIALCK clock signal occurs, then all of the registers 66–69 shift out one bit of the data which they store.

Both the LOAD signal and the SERIALCK clock signal are generated by the shift control circuit 70; and it operates in response to the enable signal E5 which enables a word of the TMS bit stream to be loaded into register 65. After the enable signal E5 causes the TMS register to be loaded, the shift control circuit 70 starts to generate the SERIALCK clock signal on line 70a. This is done by gating the bus clock signal BUSCK from clock line 58 to clock line 70a.

For the first cycle of the SERIALCK clock signal, the shift control circuit 70 sends the LOAD signal as a "1" to all of the serial-parallel registers 66–69; and that causes the registers 66–69 to store one word of the bit streams that are held in the registers 62–65. Then, the shift control circuit 70 generates the LOAD signal as a "0" which causes each of the parallel-to-serial registers 66–69 to shift out the word of the bit streams that they have stored.

Each bit from the registers 66–69 is shifted in synchronization with the SERIALCK clock. The KASK bit stream is shifted onto signal line 66a; the TDI bit stream is shifted onto signal line 67a; the ETDO bit stream is shifted onto signal line 68a; and the TMS bit stream is shifted onto signal line 69a. This shifting continues, in response to the "0" state of the LOAD signal, until each of the shift registers 66–69 is emptied.

If any one of the bit streams MASK, TDI, ETDO and TMS extend into a second word, those words will be read from the memory 13 and loaded into the registers 62–65 by the pattern generator state machine 40, while the above shifting occurs. In that case, the shift control circuit 70 will remember that the enable signal E5 was again sent for a second time to the TMS register 65.

Later, when the shift register 66–69 become empty, the shift control circuit 70 will check to see if the second enable signal ES was sent. If it was, the shift control circuit 70 will again send the LOAD signal as a "1" to all of the serial-parallel registers 66–69; and that will cause registers 66–69 to store the second word of the bit streams that are held in the registers 62–65. Then, the shift control circuit 70 will generate the LOAD signal as a "0" until each of the parallel-to-serial registers 66–69 shift out the second word of the bit stream that they have stored.

The above loading and shifting continues until the end of the serial bit streams is reached for an instruction in the memory 13. Then, when the last bit of the bit streams is shifted from the registers 66–69, the shift control circuit 70 stops generating the clock signal SERIALCK on the clock line 70a.

In addition to all of the above-described operations, the chip driver circuit of FIG. 6 also generates a clock signal TCK on a clock line 71a. This TCK clock signal is a delayed replica of the BUSCK signal on line 53; and it is generated by the variable delay circuit 71. The amount of delay through the variable delay circuit is selected by control signals on signal lines 61a that are stored in register 61.

Figure 7:
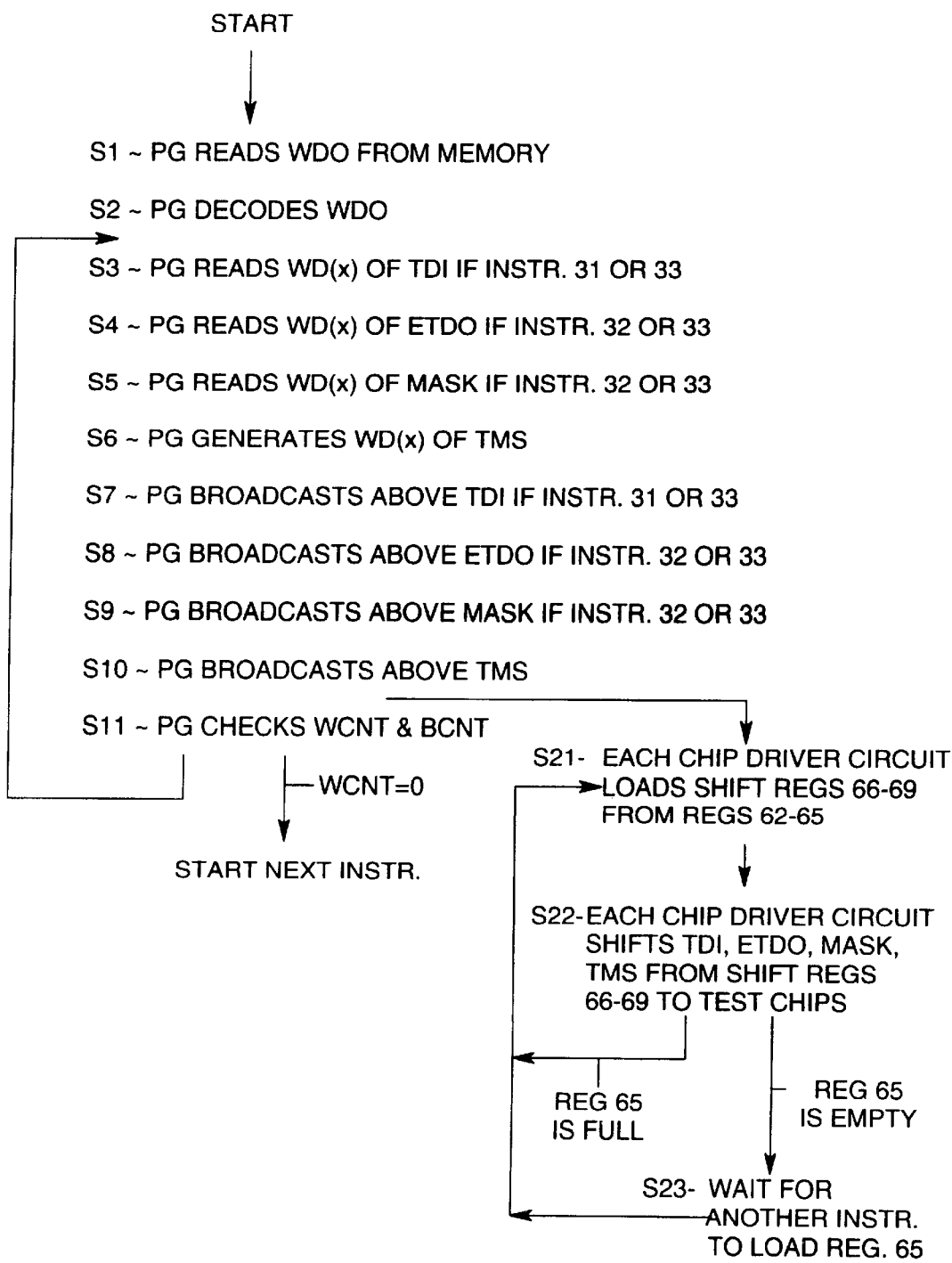
FIG. 7 shows how the pattern generators of FIG. 5 and chip driver circuits of FIG. 6 interact in the FIG. 1 system.

Referring next to FIG. 7, it illustrates the overall sequence in which each instruction in FIG. 3 is executed by the pattern generator of FIG. 5 and the chip driver circuit of FIG. 6. Initially, the pattern generator state machine 40 is in state S1 where it reads the first word WO of an instruction from its memory 13. Thereafter, in state S2, the state machine 40 examines the operation code in register 42 to determine the type of the instruction that it is executing.

If the instruction is of a first type 31 or a third type 33, then the state machine 40 reads one word of the TDI bit stream; and this occurs in state S3. That word is stored is register 44 by the state machine 40.

If the instruction is of a second type 32 or a third type 33, then the state machine 40 reads one word of the ETDO bit stream; and this occurs in state S4. That word of the ETDO bit stream is stored in register 45 by the state machine 40.

Also if the instruction is of a second type 32 or a third type 33, then the state machine 40 reads one word of the MASK bit stream; and this occurs in state S5. That word of the MASK bit stream is stored in register 46 by the state machine 40.

Thereafter, the state machine 40 internally generates one word of the TMS bit stream; and this occurs in state S6. That word of the TMS bit stream is stored in register 47 by the state machine 40.

Next in state S7, the state machine 40 broadcasts one word of the TDI bit stream if it is executing a first or third type instruction 31 or 33. This word of the TDI bit stream is sent from register 44 through the multiplexer 49 and into register 63 of each chip driver circuit that is connected to the pattern generator.

Next in state S8, the state machine 40 broadcasts one word of the ETDO bit stream if it is executing a second or third type instruction 32 or 33. This word of the ETDO bit stream is sent from register 45 through the multiplexer 49 and into register 64 of each chip driver circuit that is connected to the pattern generator.

Next in state S9, the state machine 40 broadcasts one word of the MASK bit stream if it is executing a second or third type instruction 32 or 33. This word of the MASK bit stream is sent from register 46 through the multiplexer 49 and into register 62 of each chip driver circuit that is connected to the pattern generator.

Next in state S10, the state machine 40 broadcasts one word of the TMS bit stream. This word of the TNS bit stream is sent from register 47 through the multiplexer 49 and into register 65 of each chip driver circuit that is connected to the pattern generator.

Then in state S11, the state machine 40 decrements the word count WCNT in counter 41 by one and checks to see if the result is zero. If the result is not zero, all of the operations in states S3–S10 are repeated. Otherwise, if the result is zero, the state machine 40 starts to execute the next instruction by entering state S1.

Each time the state machine 40 broadcasts a word of the TMS bit stream in state S10, that event is remembered by the shift control circuit 70 in each chip driver circuit that is connected to the pattern generator. Then, if the parallel-to-serial shift registers 66–69 are empty, they are loaded with the content of the holding register 62–65. That occurs when the chip driver circuits are in a state S21.

Thereafter, the content of the parallel-to-serial shift registers 66–69 are shifted onto the signal line 66a–69a. That occurs when the chip driver circuits is in a state S22. Then, when the last bit in the shift registers 66–69 is being shifted out, the shift control circuit 70 checks to see if register 65 has been loaded with another word of the TMS bit stream. If it has, the load and shift operations of states S21 and S22 are repeated.

When the bit streams of TDI, ETDO, MASK, and TMS are several words long, then the states S21 and S22 in chip driver circuits 11 occur concurrently with the states S3–S11 in the pattern generator 12. Due to that concurrent operation, the chip driver circuits 11 and the pattern generator 12 act as a multi-stage pipeline in which the chip driver circuits shift the bits from one word of the bit streams while the pattern generator reads and broadcasts the next word of the bit streams.

Also, when the pattern generator state machine 40 starts to execute the next instruction, the chip driver circuits 11 continue in state S22 to shift any bits that remain in the parallel-to-serial shift registers 66–69. Due to that concurrent operation, the chip driver circuits 11 and the pattern generator 12 again act as a multi-stage pipeline in which the chip driver circuits shift the bits in the bit streams of one instruction while the pattern generator is reading and decoding word WO of the next instruction.

Figure 8:
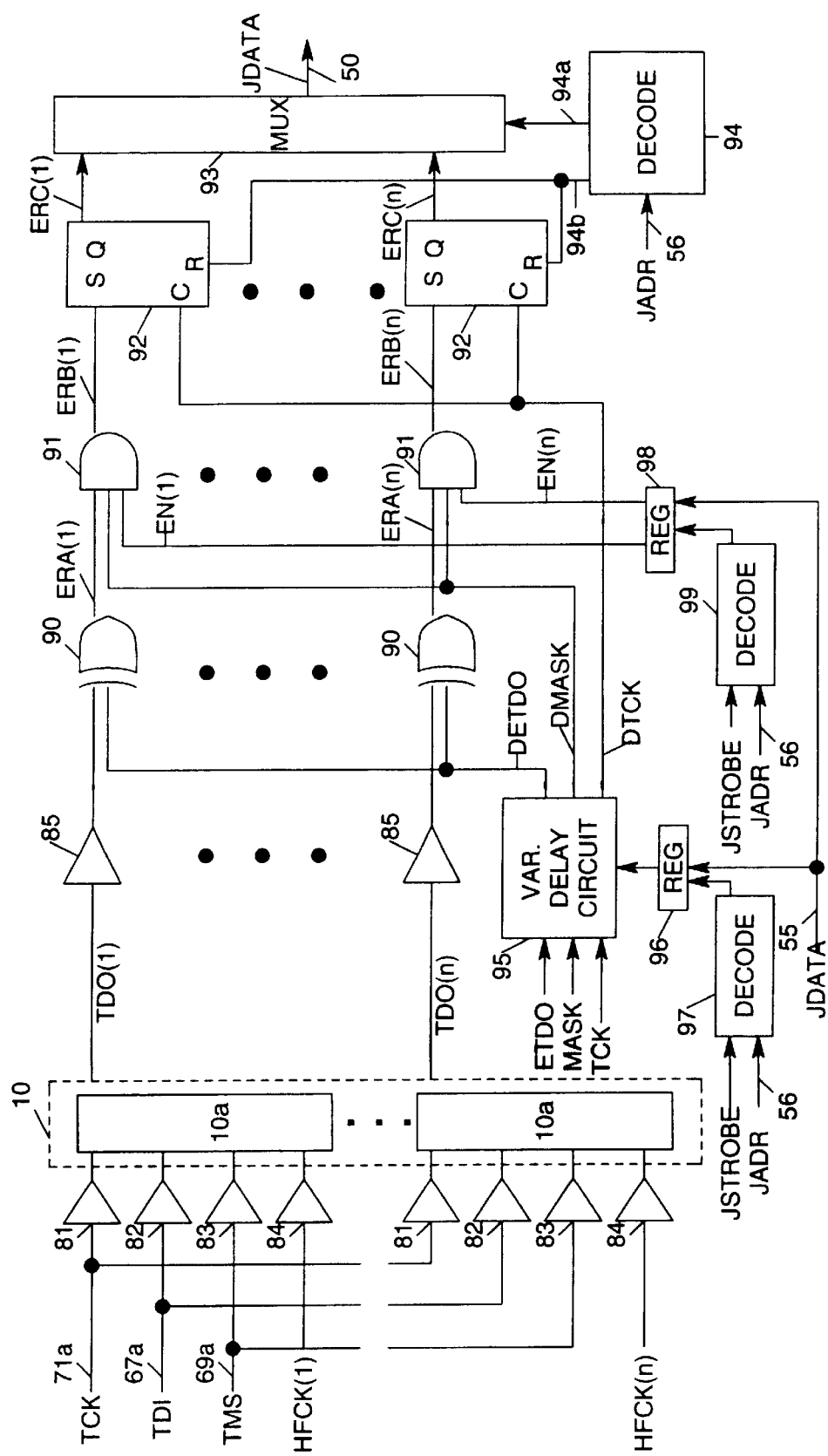
FIG. 8 shows additional circuitry on each chip driver circuit by which errors in the tested chips are detected.

Turning now to FIG. 8, it shows additional details on how each chip driver circuit is intercoupled with the integrated circuit chips that are tested. In FIG. 8, reference numeral 10 identifies the same chip assembly that is shown in FIGS. 1 and 2; and reference numeral 10a identifies the chips in the assembly 10 that are to be tested.

For each chip 10a that is to be tested in the assembly 10, a separate set of four transmitters 81–84 plus one receiver 85 is provided in the chip driver circuit 11. Each transmitter 81 sends the clock signal TCK from line 71a to a separate chip 10a. Each transmitter 82 sends the bit stream TDI from line 67a to a separate chip 10a. Each transmitter 83 sends the bit stream TMS from line 69a to a separate chip 10a. And, each transmitter 84 sends a respective high frequency clock HFCK(i), which will be described later in conjunction with FIGS. 9 and 10, to a separate chip 10a.

In response to the signals that are received from the transmitters 81–84, each chip 10a in the assembly 10 generates a separate output bit stream which is called TDO. That TDO bit stream, from each chip 10a, is sent to a separate receiver 85 on the chip driver circuit. From the receivers 85, all of the TDO bit streams are processed in parallel by the remaining components 90–98 of the chip driver circuit which are shown in FIG. 8.

Component 90 in FIG. 8 is an EXCLUSIVE-OR gate; component 91 is an AND gate; and component 92 is a flip-flop. A separate set of the components 90–92 is provided for each of the receivers 85. Component 93 in FIG. 8 is a multiplexer; component 94 is a decoder circuit; component 95 is a variable delay circuit; component 96 is a register; component 97 is a decoder circuit; component 98 is a register; and component 99 is a decoder circuit.

In operation, the bit streams ETDO, MASK, and TCK are sent through the variable delay circuit 95 to thereby generate three corresponding delayed bit streams which are called DETDO, DMASK, and DTCK respectively. The amount of delay through the variable delay circuit 95 is selected by the output of register 96; and that delay compensates for a delay which occurs within each chip 10a that generates the TDO bit stream. To select a particular delay, register 96 is loaded with the JDATA signals when the decoder circuit 97 detects a predetermined JADR address.

From the delay circuit 95, the delayed bit stream DETDO is sent to all of the EXCLUSIVE-OR gates 90 where it is compared to the TDO bit streams that come from all of the receivers 85. If a miscompare occurs between any bit in the DETDO bit stream and the corresponding bit in the TDO(i) bit stream, then the EXCLUSIVE-OR gate 90 where the miscompare occurs will generate an output signal ERA(i) in a "1" state.

Each of the error signals ERA(i) from the EXCLUSIVE-OR gates 90 are sent to a separate one of the AND gates 91; and those AND gates also receive two other input signals. One such input signal is the delayed bit stream DMASK, and the other input signal is a separate enable signal EN(i) from register 98. If the error signal ERA(i) is a "1" for a particular bit in the TDO(i) bit stream and the corresponding bit in the DMASK signal is also a "1" and the enable signal EN(i) is also a "1", then the output signal ERB(i) from the i-th AND gate is a "1".

To ignore a miscompare in any one particular bit in the bit stream TDO(i), the corresponding bit in the DMASK bit stream to set to a "0". Also, an entire bit stream TDO(i) can be ignored by setting the corresponding enable signal EN(i) to a "0".

When the error signal ERB(i) from any one of the AND gates 91 becomes a "1", that will cause the corresponding flip-flop 92 to become set. Each flip-flop 92 which becomes set will thereafter remain set until it is read and reset by the pattern generator 12.

To read the error flip-flops 92, the pattern generator 12 sends a particular JADR address to the decoder circuit 94; and in response the decoder circuit 94 generates a signal on output 94a which passes the error signals from all of the flip-flops 92 through the multiplexer 93 onto the JDATA lines 50. Then the pattern generator 12 sends another JADR address which causes the decoder circuit 94 to generate a signal on output 94b that resets all of the flip-flops 92.

Next, with reference to FIG. 9, several additional circuit components 100–109 which are included within each of the chip driver circuits 11 will be described. All of these components 100–109 interact to generate a separate high frequency clock signal HFCK(i) for each chip 10a that is being tested.

Figure 9:
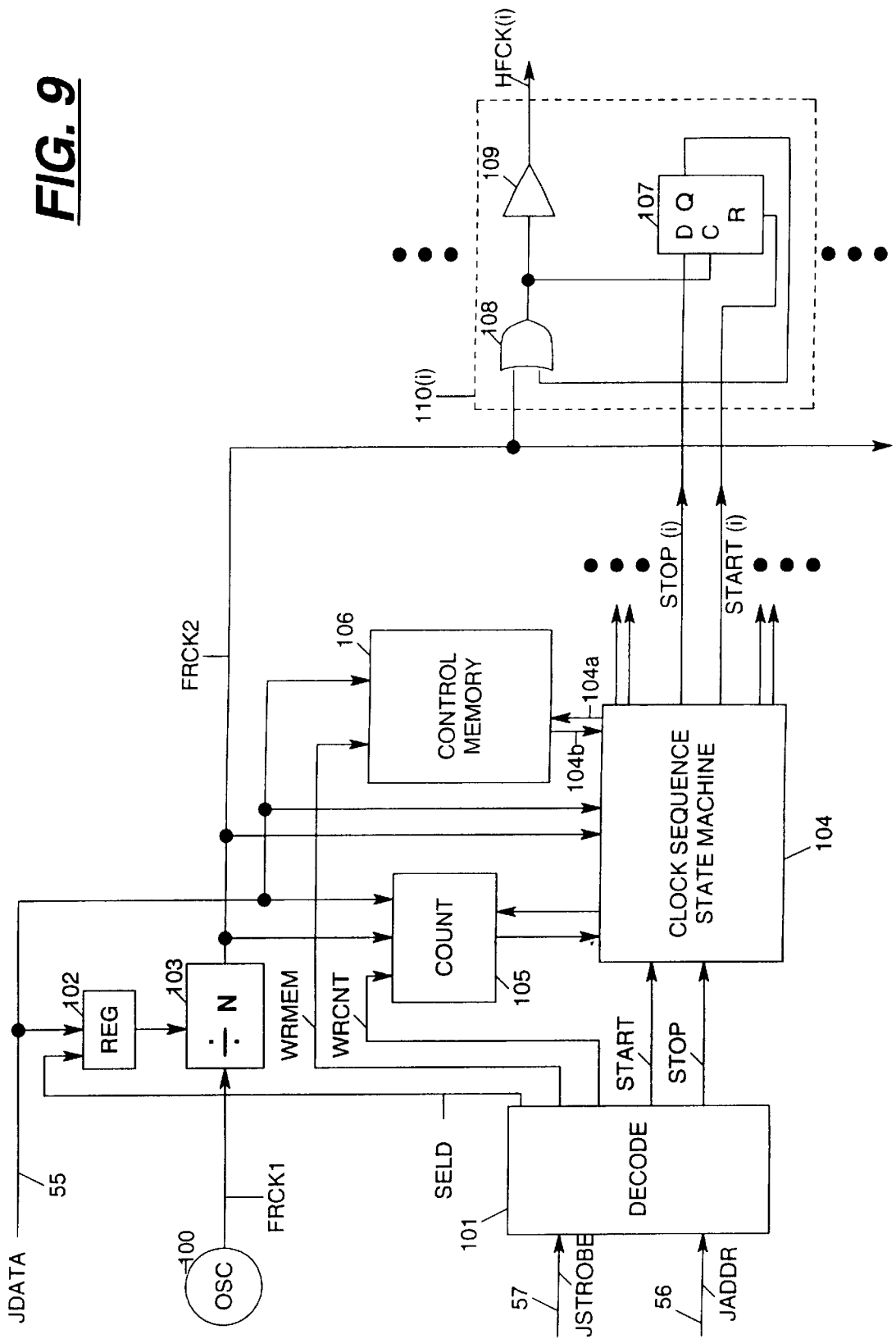
FIG. 9 shows additional circuitry on each driver circuit by which multiple chips are tested concurrently or sequentially in selectable subsets under program control.

In FIG. 9, component 100 is a free-running high frequency oscillator; component 101 is a decoder circuit; component 102 is a register; and component 103 is a divider circuit that divides by selectable integer N. Component 104 is a sequential state machine; component 105 is a counter circuit which holds a count for the state machine 104; and component 106 is a memory which holds control signals for the state machine 104. Component 107 is a flip-flop; component 108 is an OR gate; and component 109 is a transmitter. A separate set 110(i) of the components 107–109 is provided for each high frequency clock signal HFCK(i) that is generated.

In operation, the oscillator 100 generates a free running clock FRCK1 at a single high frequency. That clock signal FRCK1 is sent to the divider circuit 103 where it is reduced in frequency by a selectable integer N. Then, the output clock FRCK2 from the divider 103 is sent to each set 110(i) of the circuits 107–109.

Each set of circuits 110(i) generates the high frequency clock signal HFCK(i) by passing selectable cycles of the free running clock FRCK2. Those cycles that are passed are selected by two control signals START(i) and STOP(i); and they are generated by the sequential state machine 104.

When the signal STOP(i) is generated as a "1", the flip-flop 107 sets in synchronization with the free-running clock signal FRCK2. That set state of flip-flop 107 causes the output of OR gate 108 to constantly generate a "1"; and thus, the high frequency clock signal HFCK(i) will be stopped in a "1" state.

To reset flip-flop 107, the state machine 104 generates the STOP(i) signal as a "0" and it generates the START(i) signal as a "1". That reset state of flip-flop 107 causes the OR gate 108 to pass the clock signal FRCK2; and from the output of OR gate 108, the high frequency clock FRCK2 passes through the transmitter 109 where it becomes the clock signal HFCK(i).

In order to generate the control signals STOP(i) and START(i) for each set of the circuits 110(i), the state machine 104 reads various control bits that are stored in the control memory 106. An example of those control bits is shown by the "1"s and "0"s in FIG. 10. To read one set of the control bits, the state machine 104 sends an address on address lines 104a to the memory 106; and in response, the memory sends the addressed set of control bits back to the state machine 104 on signal lines 104b.

Figure 10:
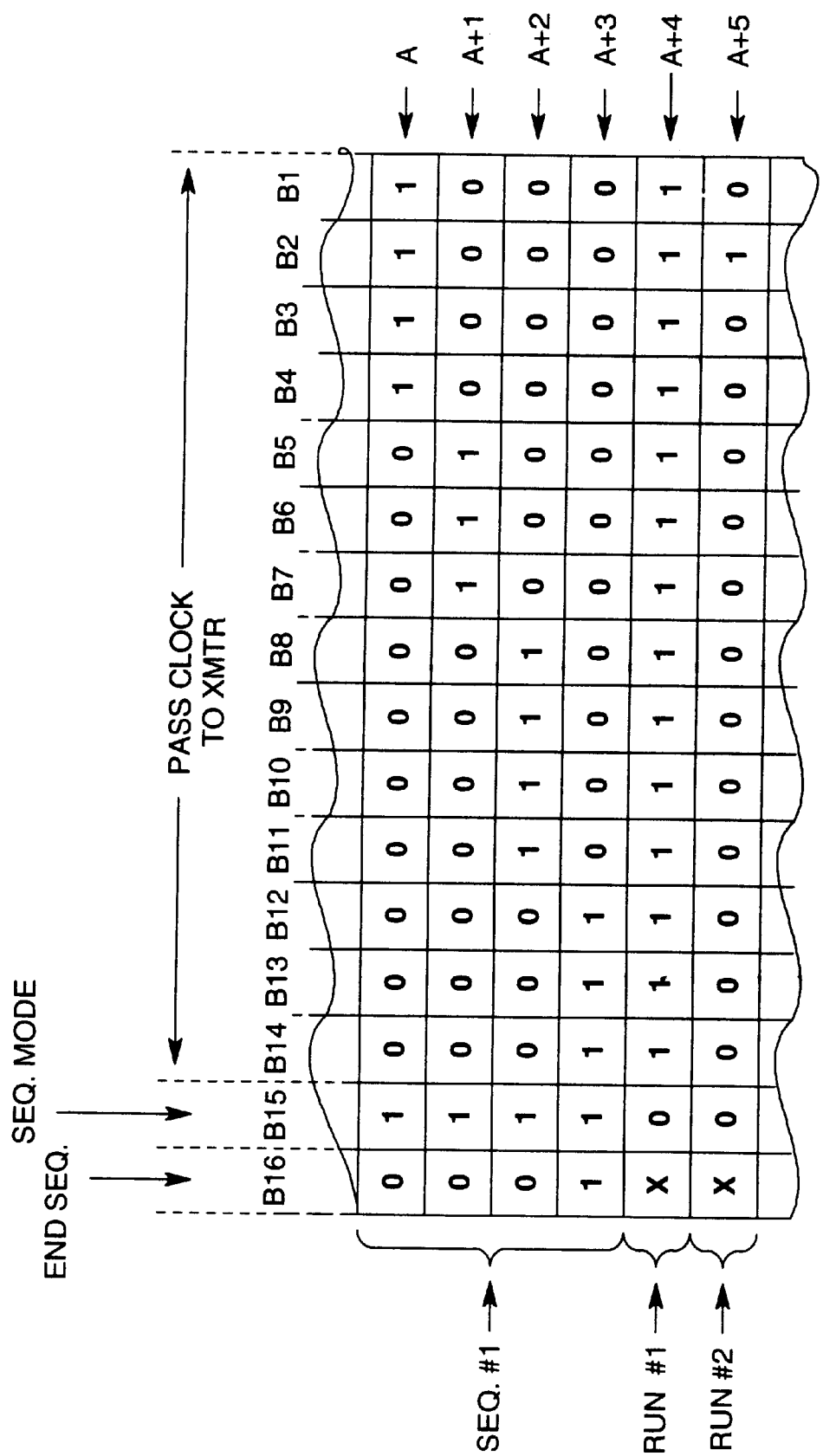
FIG. 10 shows the structure of a control memory which is a portion of the FIG. 9 circuitry.

FIG. 10 shows an example where each set of control bits consists of sixteen bits which are identified as bits B1–B16. Each of the first fourteen bits B1–B14 control the operation of a particular one of circuits 110(i). Bit B1 controls the circuit 110(1); bit B2 controls circuit 110(2); etc. The remaining bits B15 and B16 are mode control bits which cause the state machine 104 to operate in either a sequence mode or a free-running mode.

When the state machine 104 is sent a START command from the decoder 101 along with a particular memory address on the JDATA lines, it will read the set of control bits from the memory 106 at that address. If the state machine 104 reads a set of control bits in which bit B15 is a "1", then the state machine operates in the sequence mode. In that mode, the state machine 104 sequentially increments the address that it sends to the memory 106; and in response, the state machine receives the addressed set of control signals. This sequence mode of operation continues until a set of control bits is read in which bit B16 is a "1"; and then the sequence mode of operation stops.

For each set of control signals that is read in the sequence mode, the state machine 104 examines the control bits B1–B14. Each of the bits B1–B14 that is a "1" causes the state machine 104 to generate the STOP(i) and START(i) signals such that circuit 110(i) passes the clock FRCK2 for the number of cycles that is specified by the counter 105.

In FIG. 10, the set of control bits that is read by the address "A" has bits B1–B4 set to a "1". Thus, in response to that set of control bits, the state machine 104 will cause each of the circuits 110(1) through 110(4) to pass the clock signal FRCK2 for the number of cycles that is specified by the counter 105.

Next, the set of control bits that is read by the address "A+1" has bits B5–B7 set to a "1". Thus, in response to that set of control bits, the state machine 104 will cause each of the circuits 110(5) through 110(7) to pass the clock signal FRCK2 for the number of cycles that is specified by the counter 105.

Next, the set of control bits that is read by the address "A+2" has bits B8–B11 set to a "1". Thus, in response to that set of control bits, the state machine 104 will cause each of the circuits 110(8) through 110(11) to pass the clock signal FRCK2 for the number of cycles that is specified by the counter 105.

Lastly, the set of control bits that is read by the address "A+3" has bits B12–B14 set to a "1". Thus, in response to that set of control bits, the state machine 104 will cause each of the circuits 110(12) through 110(14) to pass the clock signal FRCK2 for the number of cycles that is specified by the counter 105.

By comparison, if the state machine 104 reads a set of control bits in which bit B15 is a "0", then the state machine operates in the free-running mode. In that mode, the state machine 104 does not increment the address that it sends to the memory 106; but instead, the state machine operates continuously with just the one set of the control signals that it read.

Using that single set of control signals, the state machine 104 again examines the control bits B1–B14. Each of the bits B1–B14 that is a "1" causes the state machine 104 to generate the STOP(i) and START(i) signals such that circuit 110(i) passes clock FRCK2 continuously. To end this free-running mode of operation, the state machine 104 needs to be sent a STOP command from the decoder 101; and that command is sent when the decoder 101 receives a particular JADR address.

In FIG. 10, the set of control bits that is read by the address "A+4" has bit B15 set to a "0"; and that will place the state machine 104 in the free-running mode. Also in the set of control bits at address "A+4", all of the bits B1–B14 are set to a "1"; and so in response, the state machine 104 will cause each of the circuits 110(1) thru 110(14) to continuously pass the clock signal FRCK2 until a STOP command is received.

Similarly in FIG. 10, the set of control bits that is read by address "A+5" also has B15 set to a "0"; and that will place the state machine 104 in the free-running mode. However, in the set of control bits at address "A+5", only bit B2 is set to a "1"; and so in response, the state machine 104 will cause only circuit 110(2) to continuously pass the clock signal FRCK2.

One particular feature which is achieved with the circuitry of FIGS. 9 and 10 is that it enables the chips 10a in the chip assembly 10 to be tested concurrently as one set or sequentially in selectable subsets. This feature is desirable when the chips 10a which are being tested are of a type that dissipate a large amount of power when they receive the high frequency clock signal HFCK(i), but dissipate substantially less power when they do not receive the high frequency clock signal. Such chips include for example CMOS microprocessor chips and CMOS memory chips. By limiting the number of chips 10a that simultaneously receive the high frequency clock signal HFCK(i), the total amount of power that is dissipated in all of the chips 10a can be kept below any predetermined power limit which would otherwise be exceeded if all of the chips received the high frequency clock signal.

Another particular feature which is achieved with the circuitry of FIGS. 9 and 10 is that it enables a unique stream of bits to be written into each of the chips 10a separately. That is achieved by storing control bits in the memory 106 which cause the high-frequency clock signal HFCK(i) to be sent to each of the chips 10a one at a time. Then when one particular chip is receiving the high frequency clock signal HFCK(i), the data that is to be written into that chip is sent as a TDI bit stream to all of the chips 10a. This feature is desirable when certain unique information, such as a serial number, needs to be written into each chip 10a that is being tested.

Figure 11:
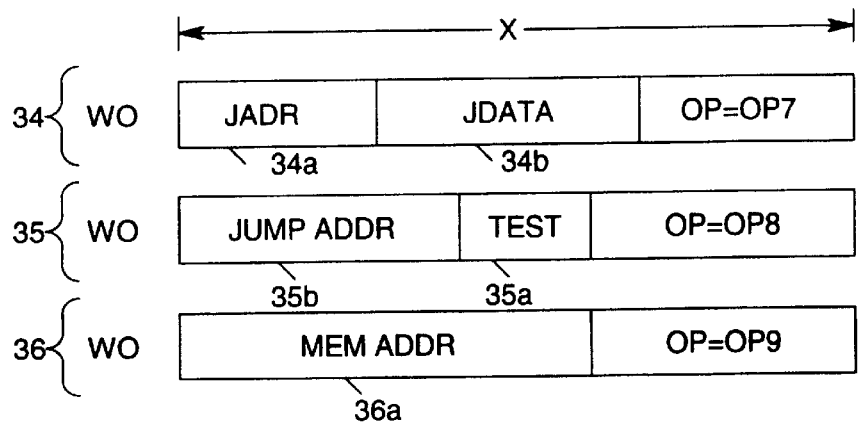
FIG. 11 shows three additional types of instructions which are executed by the chip testing system of FIG. 1.

Turning now to FIG. 11, it shows three additional instructions 34, 35 and 36 which can be included in a chip testing program in the memory 13, along with the previously described instruction 31, 32, 33 of FIG. 3. Instruction 34 is an internal control instruction which consists of only a single word W0 that includes an operation code OP7, a JADR field 34a, and a JDATA field 34b. When instruction 34 is executed by the pattern generator 12, the state machine 40 sends the JADR field 34a on to the JADR signal lines 56 and it sends the JDATA field 34b on to the JDATA signal lines 55.

Instruction 34 can be used to load register 61 in FIG. 6, to load registers 96 and 98 in FIG. 10, and to load register 102 in FIG. 9. Also instruction 34 can be used to send an address to the decoder 94 in FIG. 8, to send a count to the counter 105 in FIG. 9, to write each set of control bits in the control memory on 106. Also instruction 34 can be used to send START and STOP commands from the decoder 101 to the state machine 104.

Instruction 35 is a branch instruction which also consists of only a single word W0. Instruction 35 includes an operation code OP8, a test condition field 35a, and a jump address field 35b. When instruction 35 is executed by the pattern generator 12, the state machine 40 tests a condition which is specified by the test condition field 35a. If that tested condition is true, then the next instruction that is executed from the memory 13 occurs at the address of the branch instruction 35 minus the jump address in field 35b.

Instruction 36 is a write memory instruction that also consists of single word W0. Instruction 36 includes an operation code OP9 which identifies it as the write memory instruction, and it includes a memory address field 36a. When instruction 36 is executed by the pattern generator 12, the error signals are read from multiplexer 93 in FIG. 8 and written into memory 13 at the memory address field 36a.

One preferred embodiment of a system which tests integrated circuit chips in accordance with the present invention has now been described in detail. In addition, however, various changes and modifications can be made to the details of this embodiment without departing from the nature and spirit of the invention.

For example, FIG. 2 illustrates just one example where the chip testing system is housed in a rack 20 which has a total of fourteen slots. But as a modification, the rack 20 can have any number of slots; and there can be multiple racks. Also, the slots in each rack can be filled with any combination of the chip assembly 10, the driver circuit 11, and the pattern generator 12 together with its respective memory 13.

Similarly, FIG. 1 shows just one example where each chip assembly 10 holds only four of the integrated circuit chips 10a that are to be tested. But as a modification, each chip assembly 10 can hold any desired number of the integrated circuit chips 10a.

Also, as another modification, each of the modules 11, 12, 13 and 14 that are shown in FIG. 1 can be constructed of any type of circuitry. For example, all of the circuitry in the chip driver circuit 11 and all of the circuitry in the pattern generator 12 (as is shown in detail in FIGS. 5, 6, 8, 9, and 10) can be constructed of TTL circuits, ECL circuits, MOS circuits, and CMOS circuits. Likewise, each memory module 13 of FIG. 1 can be constructed of memory cells of any type, such as those which store data bits in flip-flops or in a capacitor or on a magnetic storage media or on an optical storage media.

Likewise, each of the sequential control circuits that are in the illustrated chip testing system can have any type of internal construction. Those sequential control circuits include the pattern generator state machine 40 in FIG. 5, the shift control circuit 70 of FIG. 6, and the clock sequence state machine 104 of FIG. 9. Any internal structure for the pattern generator state machine 40 is suitable so long as it operates in accordance with states S1–S11 of FIG. 7. Any internal structure for the chip control circuitry 70 is suitable so long as it operates in accordance with states S21–S23 of FIG. 7. And, any internal structure for the clock sequence state machine 104 of FIG. 9 is suitable so long as it operates in a sequence mode and a free running mode as described in conjunction with FIG. 10.

Also, as another modification, the number of bits which are read as a word from each memory module 13 can be any predetermined number. FIG. 3 shows that each word in the memory module 13 consists of "X" bits. Suitably, X is an integer number of bytes, such as 16 bits, 32 bits, 48 bits, 64 bits, etc.

Further, as another modification, each TMS bit stream which is generated to put the chips 10a that are tested in a particular state, can be any predefined series of bits. What each bit stream needs to be is determined by the internal structure of the chips 10a. As one specific example, the TMS bit streams can be predefined and generated as is shown below in TABLE 2.

TABLE 2

| TMS Header | State of chip 10a in response to Header |
|---|---|
| 010000 | Read INSTRUCTION REGISTER |
| 011000 | Write INSTRUCTION REGISTER |
| 011100 | Read DATA REGISTER |
| 011110 | Write DATA REGISTER |

Each TMS header in TABLE 2 is followed by a series of "1" bits which equals the number of TDO bits that are read from the INSTRUCTION/DATA REGISTER, or the number of TDI bits that are written into those registers. That series of "1" bits is followed by a series of "0" bits which continues until the next TMS header starts.

As another example, each TMS bit stream can be predefined and generated in accordance with any desired standard. One such standard is the IEEE 1149.9 Boundry Scan Standard, which is herein incorporated by reference.

Figure 12:
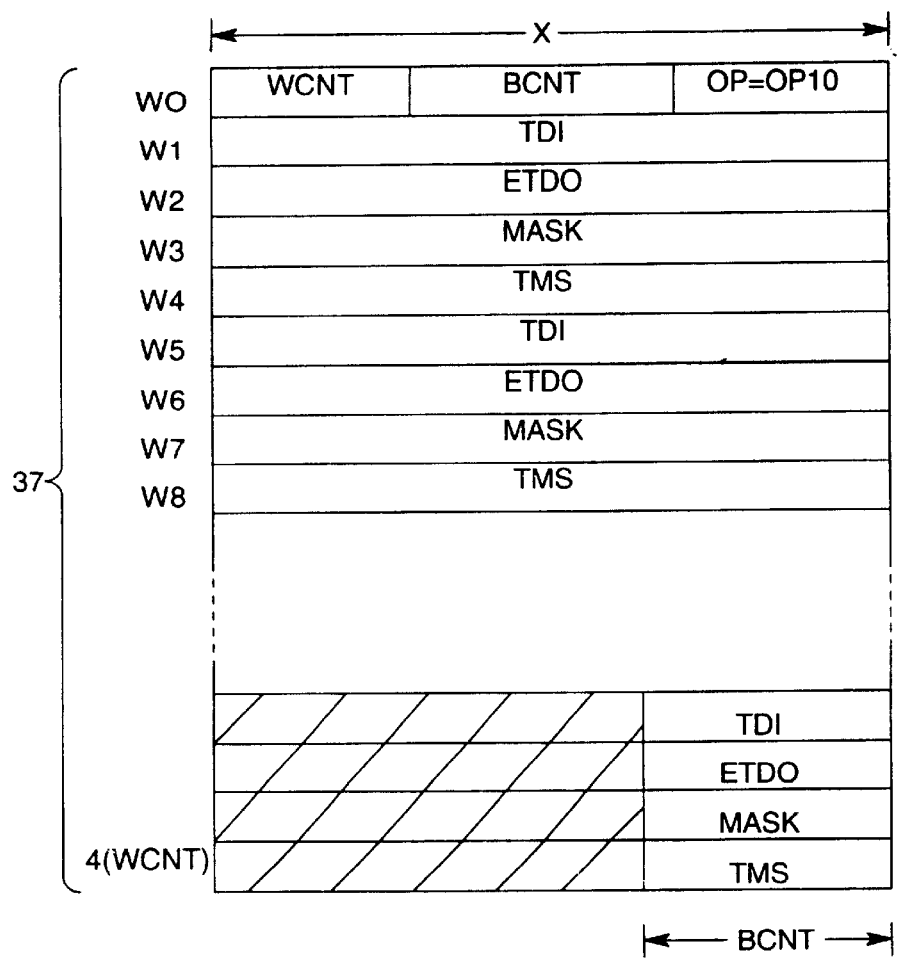
FIG. 12 shows a modification which can be made to the three instructions that are shown in FIG. 3.

In addition, FIG. 12 shows still another modification whereby all four of the bit streams TDI, ETDO, MASK and TMS that are sent by the pattern generator are expressly specified within an instruction 37. This instruction 37 is identified by an operation code of OP10 in the first word WO. Instruction 37 includes one new TMS field which specifies the TMS bit stream that is to be sent. All of the other fields BCNT, WCNT, TDI, ETDO and MASK are the same as the corresponding fields that were previously described for instruction 33 of FIG. 3.

By being able to expressly define the TMS bit streams within instruction 37, a single pattern generator 12 can sequentially test different types of chips which require different TMS bit streams to enter the same state. However, if the chips that are being tested all use the same TMS signal sequences, then instruction 33 is preferred over instruction 37 because instruction 33 occupies 25% less memory space.

As another modification, any one of the bit streams TDI, ETDO, and MASK in instruction 37 can be removed from that instruction. If the TDI bit stream is removed, then the result is similar to the previously described instruction 32 of FIG. 3, except that the TMS bit stream can be specified as desired. If the EDTO and MASK bit streams are removed from instruction 37, then the result is similar to the previously described instruction 31 of FIG. 3, except that the TMS bit stream can again be specified as desired.

Accordingly, it is to be understood that the present invention is not limited to the details of any one particular embodiment or modification, but is defined by the appended claims.

What is claimed is:

1. A program storage device, readable by a pattern generator, which stores a series of variable length instructions that direct said pattern generator to test an integrated circuit chip through a test port on said chip;

each variable length instruction including a respective set of at least one serial bit stream for use in said test, and a code which indicates the number of bit streams in said set;

each serial bit stream in each respective set consisting of a selectable number of bits which start on a word boundary and range in increments of one bit from a predetermined minimum to a predetermined maximum;

a respective series of unused bits, that start immediately after each serial bit stream which is not an integer number of bits, and which end on a word boundary; and, each respective set, which has multiple bit streams, being stored in said storage device such that corresponding words of said multiple bit streams are interleaved.

2. A program storage device according to claim 1 wherein said variable length instructions direct said pattern generator to internally generate an additional control bit stream for placing said chip in particular states.

3. A program storage device according to claim 2 wherein said set consists of a single bit stream to write into said chip, and said control bit stream places said chip in a state where the writing occurs.

4. A program storage device according to claim 2 wherein said set consists of two bit streams for selecting and comparing output data from said chip, and said control bit stream places said chip in a state where the selecting and comparing occurs.

5. A program storage device according to claim 2 wherein said set consists of three bit streams to respectively write into said chip, and select and compare output data from said chip, and said control bit stream places said chip in a state where the writing, selecting, and comparing occurs.

6. A program storage device according to claim 1 wherein said set includes a control bit stream which places said chip in particular states.

7. A program storage device according to claim 6 wherein said set further includes one data bit stream to write into said chip while said chip is in said particular states.

8. A program storage device according to claim 6 wherein said set further includes two data bit streams for selecting and comparing output data from said chip while said chip is in said particular states.

9. A program storage device according to claim 6 wherein said set further includes three data bit streams to respectively write into said chip, and select and compare output data from said chip while said chip is in said particular states.

10. A program storage device according to claim 1 wherein said range of each serial bit stream is at least, one-thousand bits.

11. A program storage device according to claim 1 wherein each word holds an integer multiple of eight bits of a serial bit stream.

12. A program storage device according to claim 1 wherein said program storage device is an integrated circuit memory.

13. A program storage device according to claim 1 wherein said program storage device is a magnetic storage media.

* * * * *